United States Patent
Zhan et al.

(10) Patent No.: US 12,048,138 B2
(45) Date of Patent: Jul. 23, 2024

(54) METHOD FOR PREPARING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Kangshu Zhan, Hefei (CN); Qiang Wan, Hefei (CN); Penghui Xu, Hefei (CN); Tao Liu, Hefei (CN); Sen Li, Hefei (CN); Jun Xia, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 418 days.

(21) Appl. No.: 17/502,324

(22) Filed: Oct. 15, 2021

(65) Prior Publication Data
US 2022/0310606 A1    Sep. 29, 2022

Related U.S. Application Data

(63) Continuation of application No. PCT/CN2021/109356, filed on Jul. 29, 2021.

(30) Foreign Application Priority Data

Mar. 29, 2021   (CN) .......................... 202110334029.3

(51) Int. Cl.
   *H10B 12/00*   (2023.01)
   *H01L 49/02*   (2006.01)
(52) U.S. Cl.
   CPC ............. *H10B 12/03* (2023.02); *H01L 28/91* (2013.01); *H01L 28/92* (2013.01); *H10B 12/033* (2023.02); *H10B 12/0335* (2023.02)
(58) Field of Classification Search
   CPC ......... H01L 28/90; H01L 28/91; H01L 28/92; H10B 12/03; H10B 12/033
   See application file for complete search history.

(56) References Cited

U.S. PATENT DOCUMENTS 6,746,876 B2   6/2004  Itoh et al.
2003/0228733 A1*  12/2003  Itoh .................. H01L 28/91
                                            257/E21.019

(Continued)

FOREIGN PATENT DOCUMENTS

CN         1467822 A       1/2004
CN       107910327 A       4/2018

(Continued)

OTHER PUBLICATIONS

International Search Report cited in PCT/CN2021/109356, mailed Dec. 30, 2021, 10 pages.

*Primary Examiner* — Robert G Bachner
*Assistant Examiner* — Molly K Reida
(74) *Attorney, Agent, or Firm* — Kilpatrick Townsend & Stockton LLP

(57) ABSTRACT

The present application provides a method for preparing a semiconductor structure and a semiconductor structure, relating to the technical field of semiconductors. The method for preparing a semiconductor structure includes: providing a base; forming a support layer having capacitor holes and electric contact structures; forming a first dielectric layer in the capacitor holes, the first dielectric layer surrounding first intermediate holes; forming a first electrode layer in the first intermediate holes, the first electrode layer filling the first intermediate holes; removing part of the support layer to form second intermediate holes; forming a second dielectric layer in the second intermediate holes, the first dielectric layer and the second dielectric layer forming a dielectric layer; and, forming a second electrode layer on the dielectric layer.

15 Claims, 7 Drawing Sheets

(56) References Cited

U.S. PATENT DOCUMENTS

2019/0267383 A1    8/2019  Rocklein et al.
2020/0027947 A1*  1/2020  Kwon et al.
2020/0111684 A1*  4/2020  Choi .................. H01L 23/3192
2021/0343833 A1* 11/2021  Lu ......................... H10N 97/00

FOREIGN PATENT DOCUMENTS

| CN | 110752202 A | 2/2020 |
|----|-------------|--------|
| CN | 111106095 A | 5/2020 |
| CN | 111755381 A | 10/2020 |
| CN | 111771279 A | 10/2020 |
| CN | 112436007 A | 3/2021 |
| CN | 113097140 A | 7/2021 |

* cited by examiner

METHOD FOR PREPARING SEMICONDUCTOR STRUCTURE AND SEMICONDUCTOR STRUCTURE

CROSS-REFERENCE TO RELATED APPLICATIONS

This is a continuation of International Application No. PCT/CN2021/109356, filed on Jul. 29, 2021, which claims the priority to the Chinese Patent Application 202110334029.3, titled "METHOD FOR PREPARING SEMICONDUCTOR STRUCTURE AND SEMICONDUCTOR STRUCTURE", filed to the CNIPA on Mar. 29, 2021. The entire contents of International Application No. PCT/CN2021/109356 and Chinese Patent Application 202110334029.3 are incorporated herein by reference.

TECHNICAL FIELD

The present application relates to the technical field of semiconductors, and in particular to a method for preparing a semiconductor structure and a semiconductor structure.

BACKGROUND

A dynamic random access memory (DRAM) usually consists of a plurality of repetitive memory units, each of which usually includes a capacitor structure and a transistor. The gates of the transistors are connected to word lines, the drains thereof are connected to bit lines, and the sources thereof are connected to the capacitor structures. The voltage signals on the word lines can control the on or off of the transistors, so that the data information stored in the capacitor structures is read through the bit lines, or the data information is written into the capacitor structures through the bit lines for storage.

In the related art, during the formation of the capacitor structures, a support layer is generally formed on the base, the support layer including parts of support layer arranged at intervals and parts of a sacrificial layer arranged between adjacent parts of support layer; then, a plurality of capacitor holes arranged at intervals are formed in the support layer, and a first electrode layer is formed on inner walls of the capacitor holes after the capacitor holes are formed; and finally, the sacrificial layer is removed, and a dielectric layer and a second electrode layer are successively formed at the capacitor holes and the position where the sacrificial layer is removed, to form a plurality of double-sided capacitors.

However, with the continuous progress of process technology, the increasing integration of DRAM and the continuous reduction of element size, the capacitor structures formed by the above method are likely to collapse, thereby reducing the yield of semiconductor structures.

SUMMARY

In accordance with a first aspect of the embodiments of the present application, a method for preparing a semiconductor structure is provided, comprising:
providing a base, the base comprising a plurality of active areas;
forming a support layer on the base, and forming a plurality of electric contact structures in the support layer, the electric contact structures being in one-to-one correspondence to the active areas;
forming a plurality of capacitor holes arranged at intervals in the support layer, each of the capacitor holes exposing each of the electric contact structures;
forming a first dielectric layer on sidewalls of the capacitor holes, the electric contact structures being exposed in first intermediate holes surrounded by the first dielectric layer;
forming a first electrode layer in the first intermediate holes, the first electrode layer filling the first intermediate holes, the first dielectric layer and the first electrode layer forming intermediate capacitor structures;
removing part of the support layer to form second intermediate holes, the second intermediate holes exposing outer circumferential surfaces of the intermediate capacitor structures;
forming a second dielectric layer in the second intermediate holes, the first dielectric layer and the second dielectric layer forming a dielectric layer; and
forming a second electrode layer on the dielectric layer, the second electrode layer, the dielectric layer and the first electrode layer forming capacitor structures.

In accordance with a second aspect of the embodiments of the present application, a semiconductor structure is provided, the semiconductor structure is prepared by the method for preparing a semiconductor structure described above;
wherein the semiconductor structure comprises a base, a support layer arranged on the base and capacitor structures arranged in the support layer, and the capacitor structures comprise a first electrode layer, and a dielectric layer and a second electrode layer successively arranged around the first electrode layer.

REFERENCE NUMERALS

10: base;
20: support layer;
21: first support layer;
22: first sacrificial layer;
23: second support layer;
231: second etching hole;
24: second sacrificial layer;
25: third support layer;
251: first etching hole;
26: electric contact structure;
30: capacitor hole;
40: first dielectric layer;
41: initial first dielectric layer;
50: first intermediate hole;
60: first electrode layer;
70: second intermediate hole;
80: dielectric layer;
90: second electrode layer; and
100: capacitor structure.

DETAILED DESCRIPTION

In order to increase the storage capacities of the capacitor structures, the capacitor holes in the semiconductor structure have developed at a high aspect ratio. During the formation of the first electrode layer in the capacitor holes, the first electrode layer also have a high aspect ratio, so that the difficulty in the preparation of the first electrode layer will be increased, the risk of collapse of the first electrode layer is increased, and the yield of the semiconductor structure is reduced.

In view of the above technical problems, the embodiments of the present application provide a method for preparing a semiconductor structure and a semiconductor structure. By forming a first electrode layer in first intermediate holes and filling the first intermediate holes by the first electrode layer, the volume of the first electrode layer can be increased, and the strength of the first electrode layer can be improved, so that the capacitor structures can be prevented from collapse and the yield of the semiconductor structure can be improved.

In order to make the objectives, features and advantages of the embodiments of the present application more obvious and understandable, the technical solutions in the embodiments of the present application will be described below clearly and completely with reference to the drawings in the embodiments of the present application. Apparently, the embodiments to be described are only some but not all of the embodiments of the present application. Based on the embodiments of the present application, all other embodiments obtained by a person of ordinary skill in the art without paying any creative effort shall fall into the protection scope of the present application.

Figure 1:
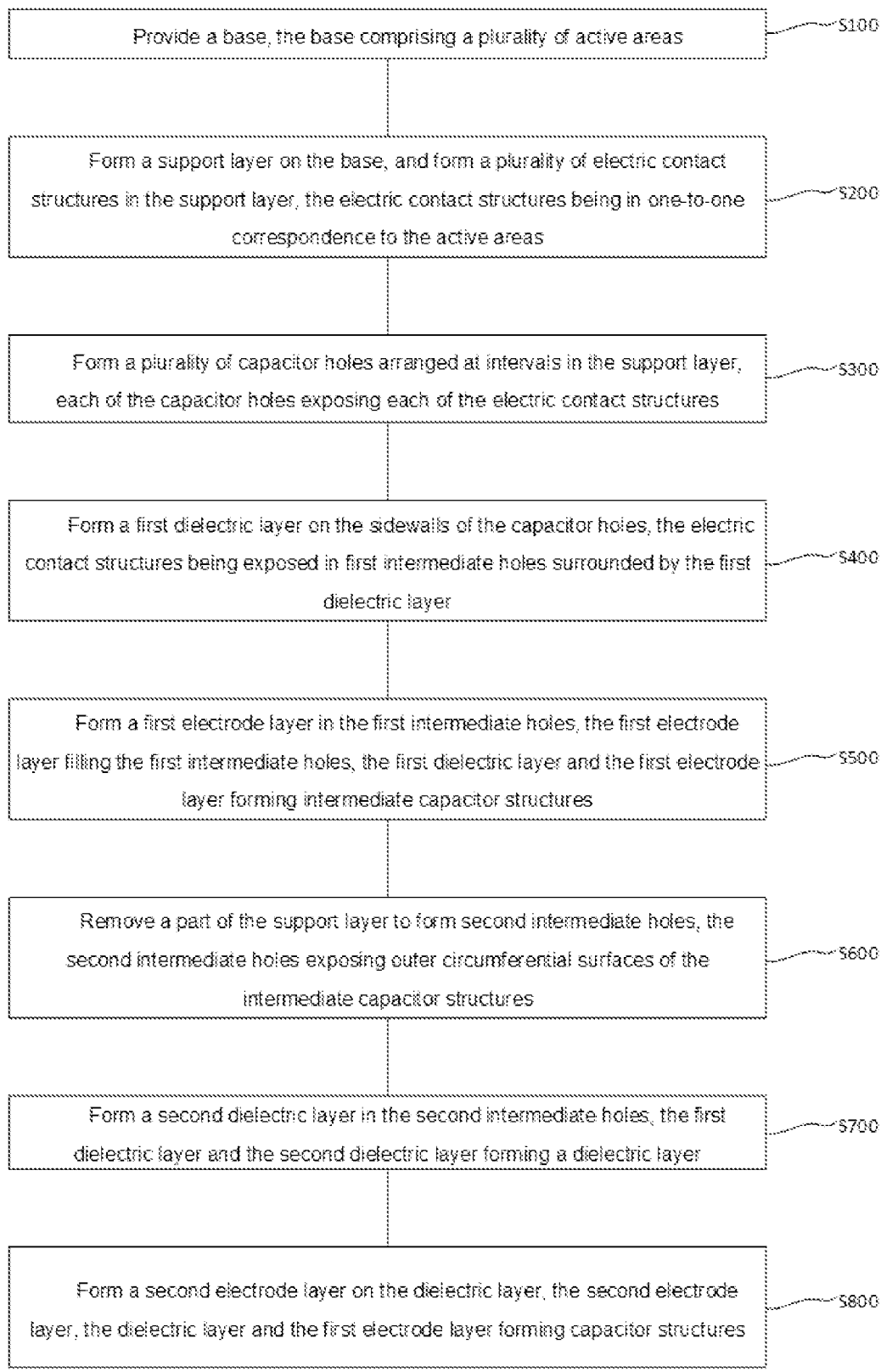
FIG. 1 is a flowchart of a method for preparing a semiconductor structure according to embodiments of the present application.

FIG. 1 is a flowchart of a method for preparing a semiconductor structure according to an embodiment of the present application, and FIGS. 2-12 are schematic diagrams of various stages of the method for preparing a semiconductor structure. The method for preparing a semiconductor structure will be described in detail below with reference to FIGS. 2-12.

The semiconductor structure will be not limited in this embodiment. The following description will be given by taking the semiconductor structure being a DRAM as an example, but this embodiment is not limited thereto, and the semiconductor structure in this embodiment may be other structures.

As shown in FIG. 1, the method for preparing a semiconductor structure according to an embodiment of the present application comprises:

Step S100: A base is provided, the base comprising a plurality of active areas.

Figure 2:
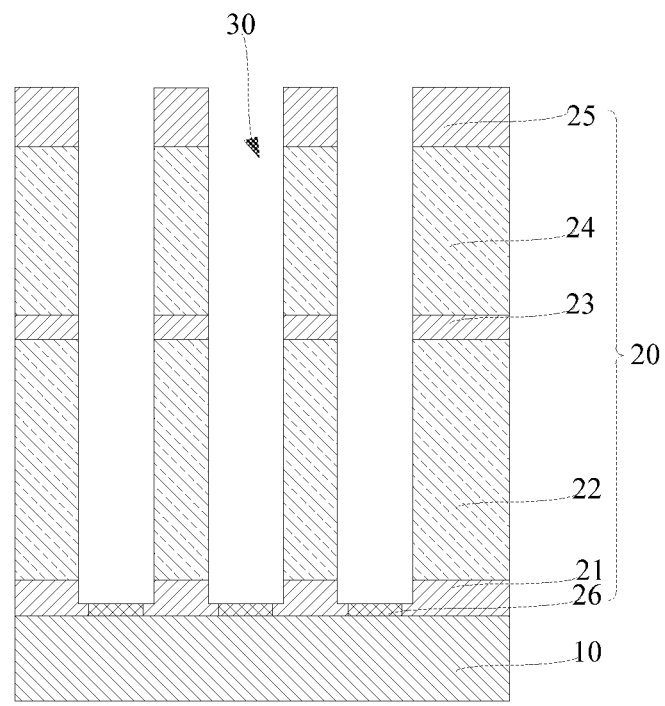
FIG. 2 is a schematic structure diagram of forming capacitor holes in the method for preparing a semiconductor structure according to an embodiment of the present application.

Exemplarily, as shown in FIG. 2, the base 10 serves as a support component of the semiconductor structure to support other components arranged thereon. The base 10 may be made of a semiconductor material. The semiconductor material may be one or more of silicon, germanium, silicon germanium compounds and silicon carbon compounds.

The plurality of active areas are formed in the base 10. The plurality of active areas can be arranged in the base 10 in an array, and the active areas can be strip-shaped. The lengthwise direction of each active area 12 extends in a first direction that can form a certain included angle with the horizontal direction.

S200: A support layer is formed on the base, and a plurality of electric contact structures are formed in the support layer, the electric contact structures being in one-to-one correspondence to the active areas.

Continuously referring to FIG. 2, the support layer 20 may be formed on the base 10 by atomic layer deposition process, physical vapor deposition process or chemical vapor deposition process. In this embodiment, the support layer 20 may be of a stacked structure. For example, the support layer 20 may comprise a first support layer 21, a first sacrificial layer 22, a second support layer 23, a second sacrificial layer 24 and a third support layer 25 which are successively stacked. The first support layer 21 is arranged on the base 10.

The materials of the first support layer 21, the second support layer 23 and the third support layer 25 may include silicon nitride or other insulating materials, and the materials of the first sacrificial layer 22 and the second sacrificial layer 24 may include silicon oxide or other insulating materials.

The electric contact structures 26 may be formed in the first support layer 21. Specifically, a plurality of recesses in one-to-one correspondence to the active areas may be firstly formed in the first support layer 21, so that electric contact structures 26 are subsequently formed in the recesses to realize electrical connection to the active areas.

The electric contact structures 26 are formed in the recesses. The top surfaces of the electric contact structures 26 are lower than the top surface of the first support layer 21. That is, tungsten or other conductive materials may be deposited in the recesses by physical vapor deposition process or chemical vapor deposition process, to realize the electrical connection between the capacitor structures and the active areas.

S300: A plurality of capacitor holes arranged at intervals are formed in the support layer, each of the capacitor holes exposing each of the electric contact structures.

Specifically, it is possible to form a first photoresist layer on the third support layer 25 and then pattern the first photoresist layer to form a plurality of opening regions on the first photoresist layer, wherein the projection of each of the opening regions on the base 10 covers each of the electric contact structures 26.

Then, parts of the support layer 20 exposed in the opening regions are removed by an etching gas or an etching solution to form a plurality of capacitor holes 30 arranged at intervals in the support layer 20. The capacitor holes 30 are configured to form capacitor structures.

S400: A first dielectric layer is formed on the sidewalls of the capacitor holes, the electric contact structures being exposed in first intermediate holes surrounded by the first dielectric layer.

Figure 3:
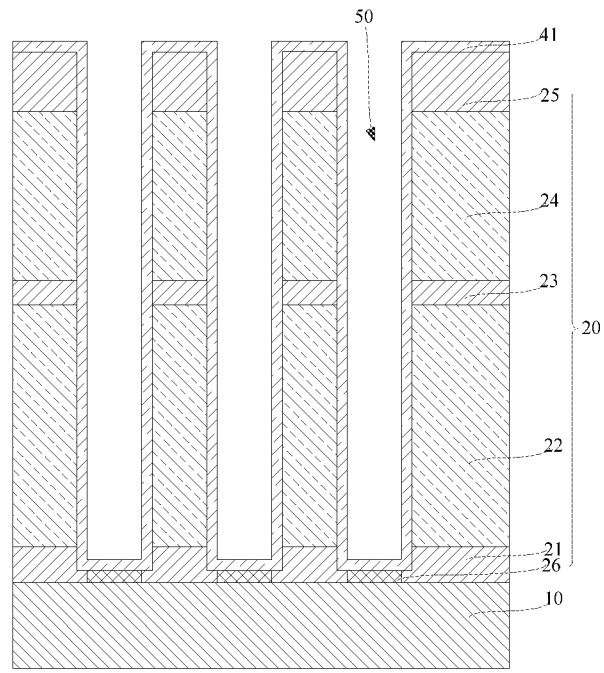
FIG. 3 is a schematic structure diagram of forming an initial first dielectric layer in the method for preparing a semiconductor structure according to an embodiment of the present application.

As shown in FIG. 3, an initial first dielectric layer 41 may be formed on the inner walls of the capacitor holes by atomic layer deposition process. The initial first dielectric layer 41 extends out of the capacitor holes 30 and covers the top surface of the support layer 20. That is, initial first dielectric layer 41 is formed on the sidewalls and bottom walls of the capacitor holes 30 and the top surface of the support layer 20.

Figure 4:
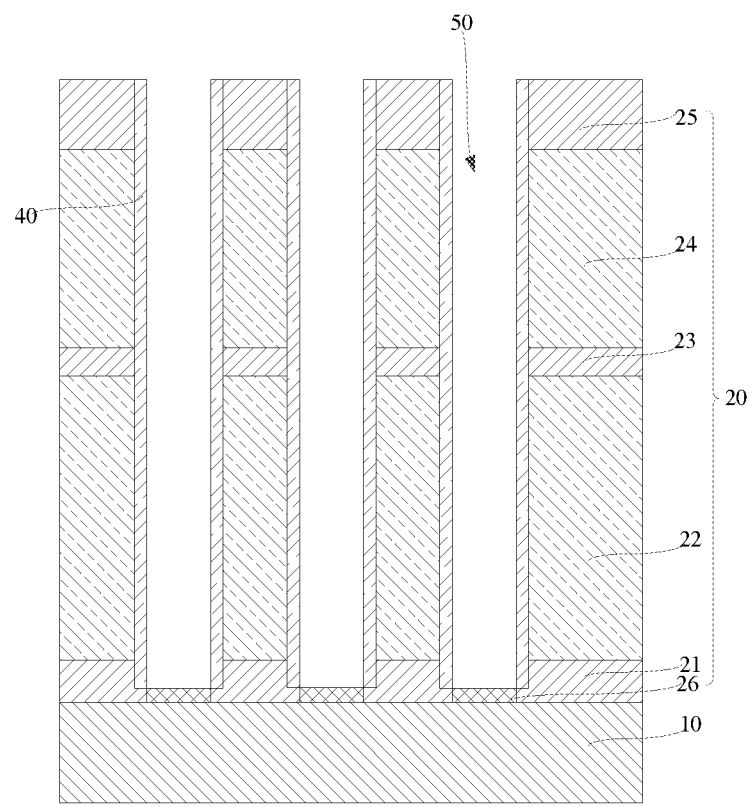
FIG. 4 is a schematic structure diagram of forming a first dielectric layer in the method for preparing a semiconductor structure according to an embodiment of the present application.

After the initial first dielectric layer 41 is formed, as shown in FIG. 4, part of the initial first dielectric layer 41 on the bottom walls of the capacitor holes 30 and the top surface of the support layer 20 can be removed by an etching gas, and part of the initial first dielectric layer 41 on the sidewalls of the capacitor holes 30 is reserved. The reserved part of initial first dielectric layer 41 forms the first dielectric layer 40. The first dielectric layer 40 encloses first intermediate holes 50. The first intermediate holes 50 are configured to expose the electric contact structures 26.

In this embodiment, the material of the first dielectric layer 40 may be a dielectric material with a high dielectric constant. For example, the dielectric material may comprise at least one of ZrOx, HfOx, ZrTiOx, RuOx, SbOx and AlOx. That is, the material of the first dielectric layer 40 may be one of the above materials or a mixture of the above materials. Optionally, the first dielectric layer 40 may be a stacked structure. For example, the first dielectric layer 40 may comprise a three-layer structure, and the materials of the three-layer structure are zirconium oxide-aluminum oxide-zirconium oxide respectively. The first dielectric layer 40 may comprise a zirconium oxide layer, an aluminum layer and a zirconium layer which are stacked successively.

In this embodiment, by defining the materials of the first dielectric layer 40, the storage capacities of the subsequently formed capacitor structures can be increased, and the performance of the semiconductor structure can be improved.

S500: A first electrode layer is formed in the first intermediate holes, the first electrode layer filling the first intermediate holes, the first dielectric layer and the first electrode layer forming intermediate capacitor structures.

Figure 5:
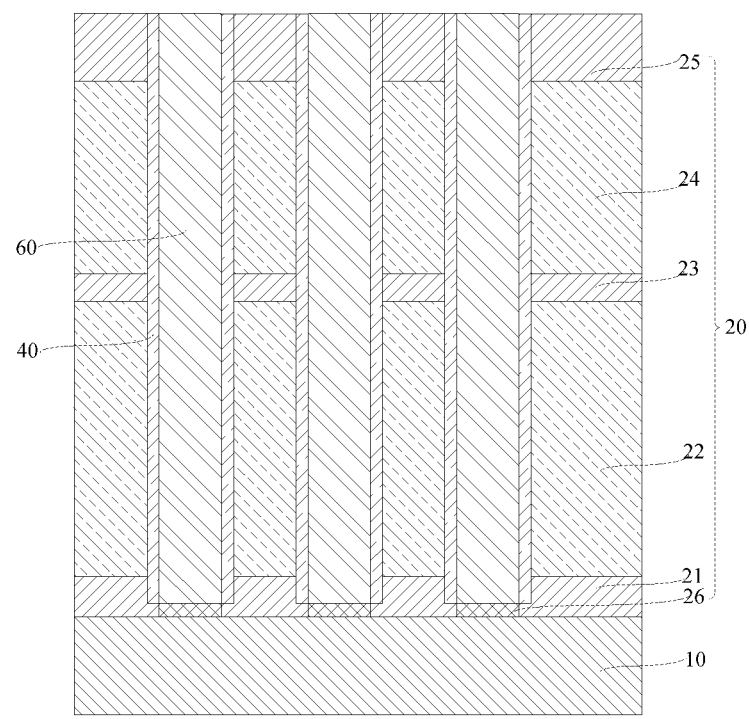
FIG. 5 is a schematic structure diagram of forming a first electrode layer in the method for preparing a semiconductor structure according to an embodiment of the present application.

As shown in FIG. 5, the first electrode layer 60 is deposited in the first intermediate holes 50 by physical vapor deposition process or chemical vapor deposition process, and the first electrode layer 60 fills the first intermediate holes 50.

The material of the first electrode layer 60 may comprise tungsten or other conductive materials. The bottom of the first electrode layer 60 comes into contact with the electric contact structures 26 to realize the electrical connection between the first electrode layer 60 and the electric contact structures 26.

In this embodiment, by forming, in the first intermediate holes, the first electrode layer filling the first intermediate holes and increasing the dielectric constant of the first dielectric layer, the volume of the first electrode layer can be increased, the capacitor structures can be prevented from collapse, the storage capacities of the capacitor structures can be ensured, and the storage performance of the semiconductor structure can be improved.

S600: Part of the support layer is removed to form second intermediate holes, the second intermediate holes exposing outer circumferential surfaces of the intermediate capacitor structures. The structure is shown in FIGS. 6-9.

Exemplarily, part of the support layer 20 can be removed by dry etching. The reserved part of support layer 20 is used to support the intermediate capacitor structures, and the reserved part of support layer 20 forms the second intermediate holes 70 exposing the outer circumferential surfaces of the intermediate capacitor structures.

Figure 6:
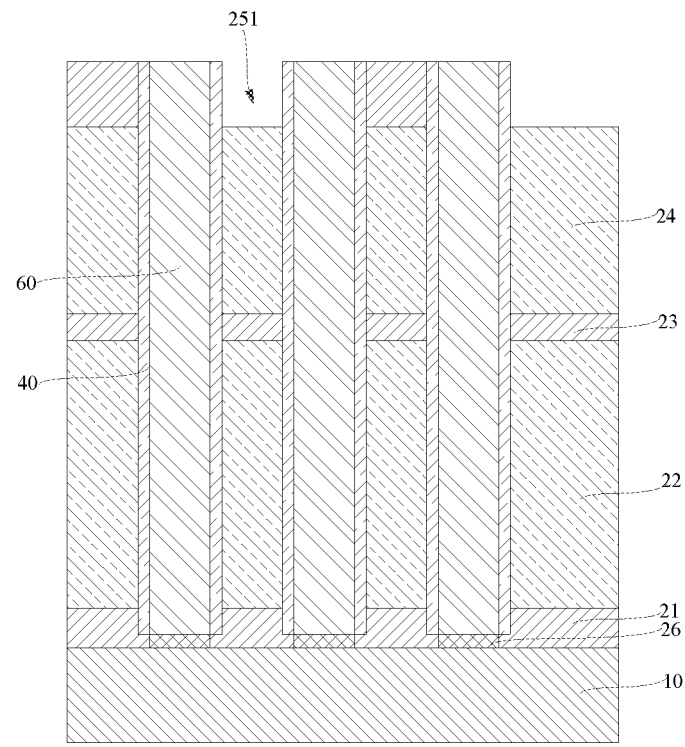
FIG. 6 is a schematic structure diagram of forming first etching holes in the method for preparing a semiconductor structure according to an embodiment of the present application.

Specifically, as shown in FIG. 6, the third support layer 25 is patterned to form first etching holes 251 in the third support layer 25, the first etching holes 251 exposing the second sacrificial layer 24, wherein the first etching holes 251 are located between adjacent parts of first electrode layer 60.

During this process, it is possible to form a second photoresist layer on the third support layer 25 and then pattern the second photoresist layer to form second openings in the second photoresist layer. The second openings are located between adjacent parts of first electrode layer 60. Then, part of the third support layer 25 exposed in the second openings is removed by an etching gas, to form the first etching holes 251 in the third support layer 25.

After the first etching holes 251 are formed, the second sacrificial layer 24, part of the second support layer 23 and the first sacrificial layer 22 can be removed to form second intermediate holes 70 in the support layer 20. The second intermediate holes 70 expose the outer circumferential surfaces of the intermediate capacitor structures.

Figure 7:
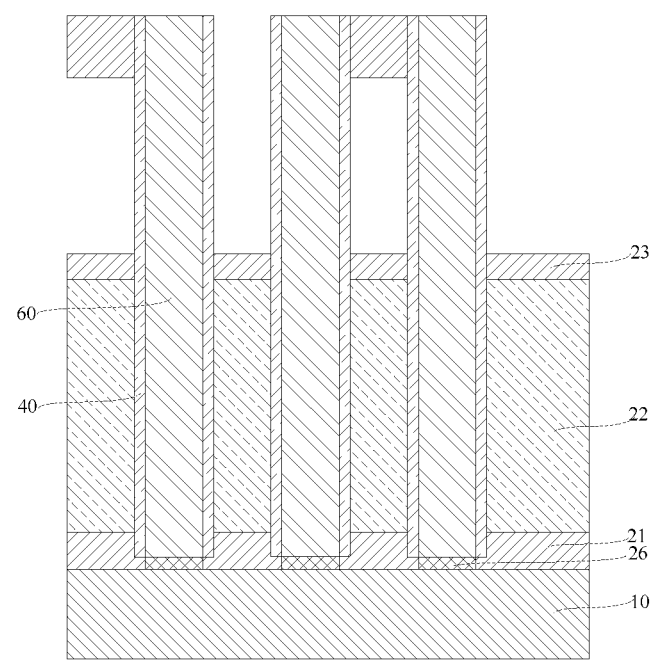
FIG. 7 is a schematic structure diagram of removing a second sacrificial layer in the method for preparing a semiconductor structure according to an embodiment of the present application.

Exemplarily, as shown in FIG. 7, firstly, the second sacrificial layer 24 exposed in the first etching holes 251 is removed.

Figure 8:
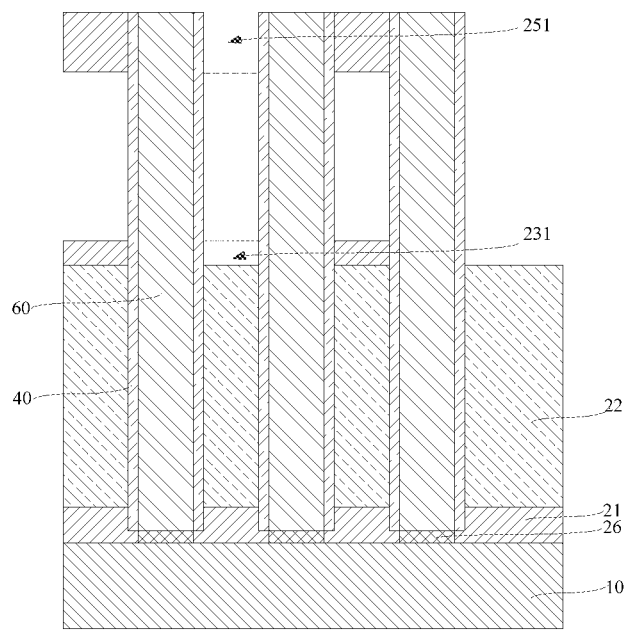
FIG. 8 is a schematic structure diagram of forming second etching holes in the method for preparing a semiconductor structure according to an embodiment of the present application.

As shown in FIG. 8, then, the second support layer 23 exposed in the first etching holes 251 is etched along the first etching holes 251 to form second etching holes 231 in the second support layer 23. The second etching holes 231 expose the first sacrificial layer 22.

Figure 9:
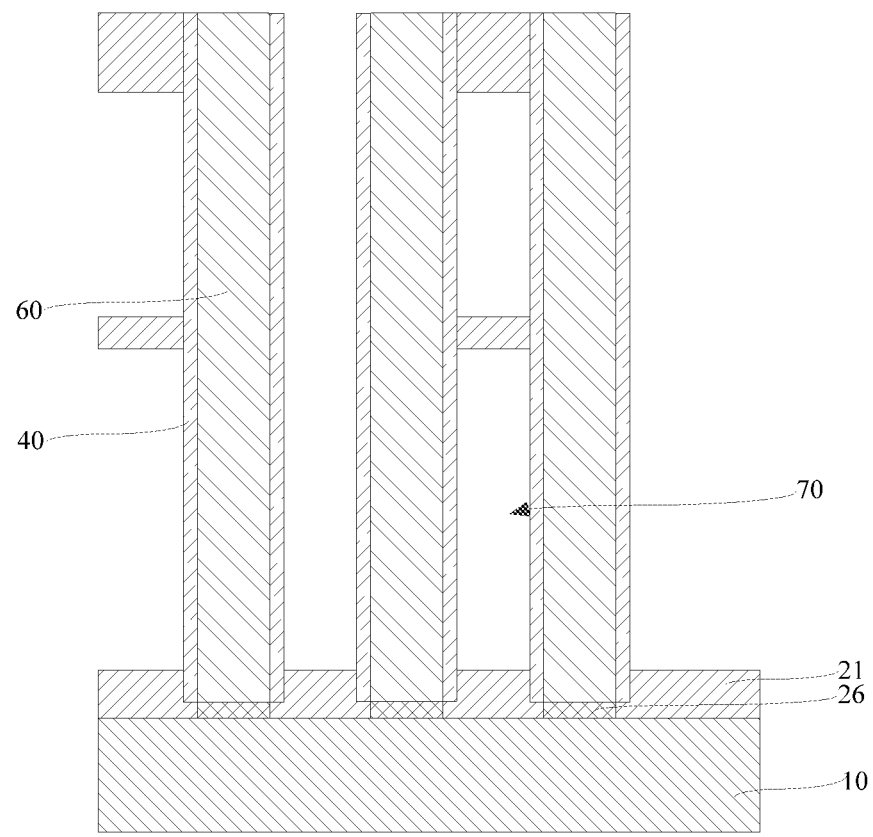
FIG. 9 is a schematic structure diagram of removing a first sacrificial layer in the method for preparing a semiconductor structure according to an embodiment of the present application.

Subsequently, as shown in FIG. 9, the first sacrificial layer 22 exposed in the second etching holes 231 is removed to form second intermediate holes 70 in the support layer 20. The second intermediate holes 70 expose the outer circumferential surfaces of the intermediate capacitor structures, that is, the second intermediate holes 70 expose the outer circumferential surfaces of the first dielectric layer 40.

S700: A second dielectric layer is formed in the second intermediate holes, the first dielectric layer and the second dielectric layer forming a dielectric layer.

Figure 10:
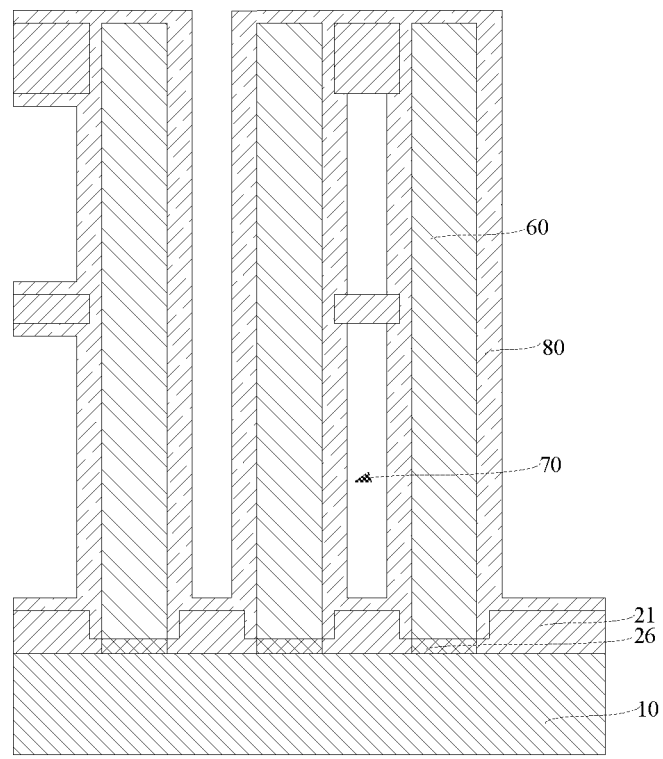
FIG. 10 is a schematic structure diagram of forming a second dielectric layer in the method for preparing a semiconductor structure according to an embodiment of the present application.

As shown in FIG. 10, a second dielectric layer covering the first dielectric layer 40 is formed in the second intermediate holes 70 and on the first dielectric layer 40, and the first dielectric layer 40 and the second dielectric layer form a dielectric layer 80.

In the related art, during the formation of a double-sided capacitor structure, a dielectric layer is usually deposited once between the first electrode layer and the second electrode layer. However, in this embodiment, it is necessary to form the first dielectric layer and then form the second dielectric layer on the first dielectric layer. The first dielectric layer and the second dielectric layer are made of the same material, and the first dielectric layer and the second dielectric layer form the dielectric layer.

S800: A second electrode layer is formed on the dielectric layer, the second electrode layer, the dielectric layer and the first electrode layer forming capacitor structures.

Figure 11:
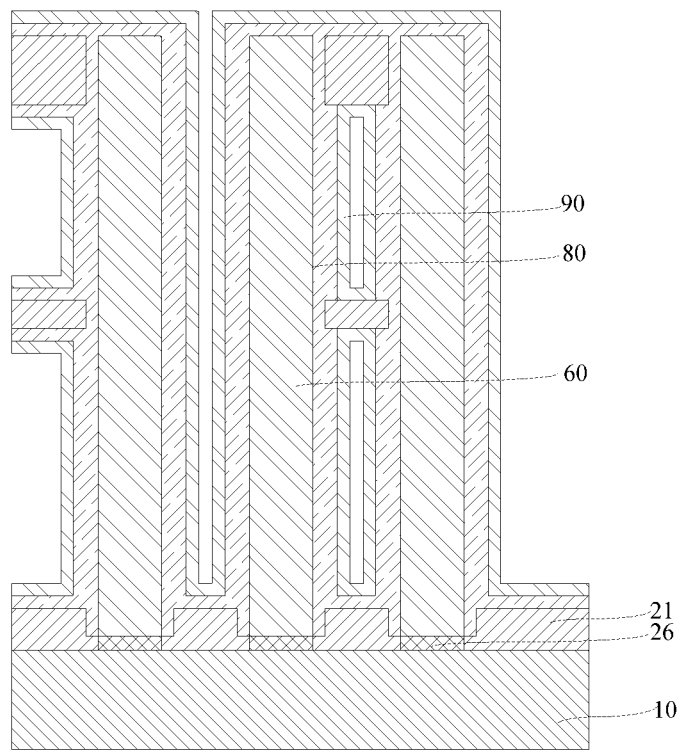
FIG. 11 is a schematic structure diagram of forming a second electrode layer in the method for preparing a semiconductor structure according to an embodiment of the present application.

As shown in FIG. 11, a second electrode layer 90 covering the second dielectric layer are formed in the second intermediate holes 70 and on the second dielectric layer by deposition process. The first electrode layer 60, the dielectric layer 80 and the second electrode layer 90 form capacitor structures.

The material of the second electrode layer 90 may be the same as the material of the first electrode layer 60, and may comprise titanium nitride or other conductive materials.

Figure 12:
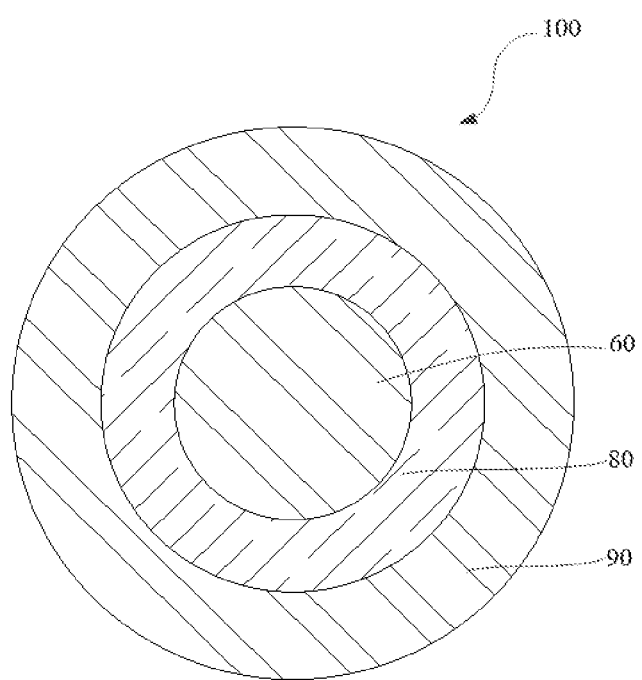
FIG. 12 is a schematic diagram of a capacitor structure in the method for preparing a semiconductor structure according to an embodiment of the present application.

The semiconductor structure according to the second aspect of the embodiments of the present application can be prepared by the method for preparing a semiconductor structure described in any one of the above embodiments. As shown in FIGS. 11 and 12, the semiconductor structure may comprise a base 10, a support layer 20 and capacitor structures 100.

The support layer 20 can be arranged on the base 10. By providing the support layer 20, a support force is provided for the capacitor structures, and the capacitor structures are prevented from collapse. In this embodiment, the support layer 20 may comprise a first support layer 21, a second support layer 23 and a third support layer 25 arranged at intervals. The first support layer 21 is arranged on the base 10.

A plurality of electric contact structures 26 are arranged at intervals in the first support layer 21. Each of the electric contact structures 26 is used to come into contact with one active area in the base 10 to realize the electrical connection between the capacitor structure and the active area.

As shown in FIG. 12, the capacitor structure 100 may comprise a first electrode layer 60, and a dielectric layer 80 and a second electrode layer 90 which are successively arranged around the first electrode layer 60. Thus, the volume of the first electrode layer 60 can be increased, and the strength of the first electrode layer can be improved. Moreover, the difficulty in the preparation of the first electrode layer is reduced, the first electrode layer can be prevented from collapse, and the yield of the semiconductor structure can be improved.

Various embodiments or implementations in this specification have been described progressively, and each embodiment focuses on the differences from other embodiments, so the same and similar parts of the embodiments may refer to each other.

In the description of this specification, the description with reference to terms "one implementation", "some implementations", "an schematic implementation", "an example", "a specific example" or "some examples" means that specific features, structures, materials or characteristics described with reference to the implementations or examples are included in at least one implementation or example of the present application.

In this specification, the schematic expressions of the terms above do not necessarily refer to the same implementation or example. In addition, the described specific features, structures, materials or characteristics may be combined in any one or more implementations or examples in a proper way.

Finally, it is to be noted that the foregoing embodiments are only used for describing the technical solutions of the present application, rather than limiting the present application. Although the present application has been described in detail by the foregoing embodiments, a person of ordinary skill in the art should understood that modifications can still be made to the technical solutions recorded in the foregoing embodiments or equivalent replacements can be made to some or all of the technical features, and these modifications or replacements do not make the essence of the corresponding technical solutions depart from the scope of the technical solutions in the embodiments of the present application.

The invention claimed is:

1. A method for preparing a semiconductor structure, comprising:
   providing a base, the base comprising a plurality of active areas;
   forming a support layer on the base, and forming a plurality of electric contact structures in the support layer, the electric contact structures being in one-to-one correspondence to the active areas, wherein the support layer comprises a first support layer, a first sacrificial layer, a second support layer, a second sacrificial layer and a third support layer successively stacked, the first support layer is arranged on the base, and the electric contact structures are arranged in the first support layer;
   forming a plurality of capacitor holes arranged at intervals in the support layer, each of the capacitor holes exposing each of the electric contact structures;
   forming a first dielectric layer on sidewalls of the capacitor holes, the electric contact structures being exposed in first intermediate holes surrounded by the first dielectric layer, wherein a bottom surface of the first dielectric layer close to the base is located in the first support layer, and the bottom surface of the first dielectric layer close to the base is flush with top surfaces of the electric contact structures;
   forming a first electrode layer in the first intermediate holes, the first electrode layer filling the first intermediate holes, the first dielectric layer and the first electrode layer forming intermediate capacitor structures;
   removing part of the support layer to form second intermediate holes, the second intermediate holes exposing outer circumferential surfaces of the intermediate capacitor structures;
   forming a second dielectric layer in the second intermediate holes, the first dielectric layer and the second dielectric layer forming a dielectric layer; and
   forming a second electrode layer on the dielectric layer, the second electrode layer, the dielectric layer and the first electrode layer forming capacitor structures.

2. The method for preparing a semiconductor structure according to claim 1, wherein the forming a first dielectric layer on sidewalls of the capacitor holes comprises:
   forming an initial first dielectric layer on the sidewalls and bottom walls of the capacitor holes and a top surface of the support layer; and
   removing part of the initial first dielectric layer on the bottom walls of the capacitor holes and the top surface of the support layer, and reserving part of the initial first dielectric layer on the sidewalls of the capacitor holes, the part of the initial first dielectric layer that is reserved forming the first dielectric layer.

3. The method for preparing a semiconductor structure according to claim 2, wherein material of the first dielectric layer is a dielectric material with a high dielectric constant.

4. The method for preparing a semiconductor structure according to claim 3, wherein the dielectric material comprises at least one of ZrOx, HfOx, ZrTiOx, RuOx, SbOx or AlOx.

5. The method for preparing a semiconductor structure according to claim 1, wherein the of removing part of the support layer comprises:
removing part of the support layer by dry etching, a reserved part of the support layer being used to support the intermediate capacitor structures, and the reserved part of the support layer forming the second intermediate holes exposing the outer circumferential surfaces of the intermediate capacitor structures.

6. The method for preparing a semiconductor structure according to claim 5, wherein the removing part of the support layer by dry etching comprises:
patterning the third support layer, to form first etching holes in the third support layer, the first etching holes exposing the second sacrificial layer, the first etching holes being located between adjacent parts of first electrode layer; and
removing the second sacrificial layer, part of the second support layer and the first sacrificial layer, to form the second intermediate holes in the support layer, the second intermediate holes exposing the outer circumferential surfaces of the intermediate capacitor structures.

7. The method for preparing a semiconductor structure according to claim 6, wherein the removing the second sacrificial layer, part of the second support layer and the first sacrificial layer, to form the second intermediate holes in the support layer comprises:
removing the second sacrificial layer;
etching the second support layer along the first etching holes, to form second etching holes in the second support layer, the second etching holes exposing the first sacrificial layer; and
removing the first sacrificial layer.

8. The method for preparing a semiconductor structure according to claim 1, wherein the forming a second dielectric layer in the second intermediate holes comprises: forming, in the second intermediate holes and on the first dielectric layer, the second dielectric layer covering the first dielectric layer.

9. The method for preparing a semiconductor structure according to claim 8, wherein the second dielectric layer is made of same material as the first dielectric layer.

10. The method for preparing a semiconductor structure according to claim 1, wherein the forming a second electrode layer on the dielectric layer comprises: forming, in the second intermediate holes and on the second dielectric layer, the second electrode layer covering the second dielectric layer.

11. The method for preparing a semiconductor structure according to claim 10, wherein materials of the first electrode layer and the second electrode layer comprise titanium nitride.

12. The method for preparing a semiconductor structure according to claim 1, wherein the forming a support layer on the base and forming a plurality of electric contact structures in the support layer, the electric contact structures being in one-to-one correspondence to the active areas comprises:
forming a plurality of recesses in the first support layer, the recesses being in one-to-one correspondence to the active areas; and
forming the electric contact structures in the recesses, the top surfaces of the electric contact structures being lower than a top surface of the first support layer.

13. The method for preparing a semiconductor structure according to claim 12, wherein material of the electric contact structures comprises tungsten.

14. The method for preparing a semiconductor structure according to claim 13, wherein materials of the first support layer, the second support layer and the third support layer comprise silicon nitride, and materials of the first sacrificial layer and the second sacrificial layer comprise silicon oxide.

15. A semiconductor structure, the semiconductor structure is prepared by the method for preparing a semiconductor structure according to claim 1;
wherein the semiconductor structure comprises the base, the support layer arranged on the base and the capacitor structures, and the capacitor structures comprise the first electrode layer, and the dielectric layer and the second electrode layer successively arranged around the first electrode layer.

* * * * *